United States Patent [19]

Noshiro et al.

[11] 4,169,731
[45] Oct. 2, 1979

[54] METHOD FOR THE PREPARATION OF A PLANOGRAPHIC PRINTING PLATE

[75] Inventors: Atsumi Noshiro, Chiba; Hiroyuki Obata, Chofu; Minoru Takamizawa; Yoshio Inoue, both of Annaka, all of Japan

[73] Assignees: Dai Nippon Printing Co. Ltd; Shin-Etsu Chemical Co. Ltd., both of Tokyo, Japan

[21] Appl. No.: 868,620

[22] Filed: Jan. 11, 1978

[30] Foreign Application Priority Data

Mar. 29, 1977 [JP] Japan .................... 52-33956

[51] Int. Cl.$^2$ .................... G03C 11/12; G03C 7/02
[52] U.S. Cl. ..................... 96/1 R; 96/28; 96/33; 96/35.1
[58] Field of Search ............. 96/28, 33, 35.1, 1 R

[56] References Cited

U.S. PATENT DOCUMENTS

| 3,961,947 | 6/1976 | Wells | 96/33 |
| 4,019,904 | 4/1977 | Noshiro et al. | 96/33 |
| 4,042,613 | 8/1977 | Takamizawa et al. | 96/33 |
| 4,058,398 | 11/1977 | Osada et al. | 96/35.1 |

*Primary Examiner*—J. Travis Brown
*Attorney, Agent, or Firm*—Toren, McGeady and Stanger

[57] ABSTRACT

A very simple and easy method for preparing dry planographic printing plates having a high printing performance and durability in the absence of dampening water is proposed. The method comprises the steps of (a) coating one surface of substrate which is transparent to ultraviolet light with an uncured photocurable silicone, (b) bringing the thus coated surface into direct contact with a surface of a base plate to form a laminate, (c) providing on the other surface of the substrate an image pattern made of a material which is opaque to ultraviolet light, (d) irradiating the laminate with ultraviolet light from above the image pattern and (e) separating the substrate from the base plate to allow a portion of the photocured silicone coating to transfer to the surface of the base plate, and a portion of the uncured silicone coating to stay in situ on the surface of the substrate.

9 Claims, 4 Drawing Figures

METHOD FOR THE PREPARATION OF A PLANOGRAPHIC PRINTING PLATE

BACKGROUND OF THE INVENTION

The present invention relates to a simple and easy method for the preparation of a printing plate for use in dry planography in the absence of dampening water.

In the prior art, various types of planographic printing plates for use in a dampening water-free printing process have been proposed. Those printing plates have drawbacks, such as, for example, poor performance as a printing plate and complicated process of manufacture. No satisfactory dry planographic printing plates are known hitherto.

As an example, a method was proposed in which a planographic printing plate is prepared by coating an aluminum base with multiple diazo type photosensitive layers formed of a diazo type photosensitive composition and an overlaying layer former of dimethylpolysiloxane gum, then subjecting the thus coated aluminum base to exposure to light through a positive transparency overlaid to insolubilize the diazo layer in the exposed areas, removing the diazo layer in the unexposed areas in the developing process, and subsequently stripping the dimethylpolysiloxane layer off the unexposed areas (see Japanese Patent Publication No. 44-23042).

As a further example, a planographic printing plate was prepared by coating an aluminum base with a diazo layer, a layer of an adhesive and a layer of a silicone rubber successively, then subjecting the thus coated aluminum base to exposure to light through an overlaid negative transparency, allowing the photosensitive layer in the exposed areas to photodecompose for development, and stripping the silicone layer off the exposed areas (see U.S. Pat. No. 3,511,178).

In the above two methods wherein the layer of non-photosensitive silicone gum or rubber is present between the diazo photosensitive layer and the positive or negative transparency, any image patterns on the positive or negative transparency can not be reproduced with high fidelity on the plate and, since the stripping of the silicone layer is carried out by utilizing the change of the solubility of the photosensitive layer in the solvent, the edges of the image areas formed can not have clear-cut sharpness. Further, the plate making process of the dry planographic printing plate proposed in the prior art is disadvantaged by the complicated successive combination of the steps of providing multiple layers on the base plate, exposure to light and development.

As a solution of the above-described problems encountered in the prior art, the inventors of the present invention have recently proposed a method in which image areas are formed by exposing bare surface of the base plate after removal of the uncured silicone resin on the areas unexposed to light of a plate having a layer of a photosensitive or photocurable silicone resin on the surface (see U.S. Pat. No. 3,865,588).

The above method of making printing plates hitherto known are defective because of the complexity of the processes in which the removal of the silicone layer from the image areas is performed by the wet process using an organic solvent after exposure to light.

Apart from the above-described wet processes, dry processes are known for the preparation of a dry planographic printing plate. In most of the dry processes, the image areas of the plate are formed with a toner by the technique of electrophotography on the surface of the layer of a cured silicone covering the base plate. This dry process, however, is defective because of difficulty in obtaining sufficiently strong adhesion between the toner laid imagewise and the surface of the cured silicone, resulting in rendering the resultant printing plates poorly durable and unsatisfactorily printable.

For example, Japanese Patent Disclosure No. 48-19305 discloses a process in which a dry planographic printing plate is prepared by forming thermally fused toner images to adhere to the cured overcoating layer of a silicone on the layer of an electrostatic latent image-forming substance which has been applied on a base plate and dried. This method of plate making is not free from the above described problem, namely, poor adhesion of the toner to the silicone, since the silicone has been cured when the toner image is formed on it, resulting in the poor printing durability of the plate.

Various attempts have been made to improve adhesion between the toner and the surface of the silicone layer. However, no successful results have been obtained. For example, Japanese Patent Disclosure No. 49-21204 discloses a method in which the toner images formed on the electrophotographic layer are transferred on to the surface of the layer of a composition composed of a silicone gum and a resin, followed by bonding with thermal fusion to produce a planographic printing plate. The printing plate thus prepared is disadvantaged by poor ink-repellency because of a resin component included in the composition so as to improve adhesion between the toner and the silicone layer.

Further, Japanese Patent Disclosures Nos. 50-71405 and 50-71406 disclose a method directed to the improvement of adhesion between the toner and the layer of the silicone, wherein the toner is transferred and bonded by thermal fusion to the surface of the silicone layer formed by coating the base plate with an uncured or semi-cured silicone resin, followed by curing of the silicone to produce a finished planographic printing plate. The storability of the plate before curing is disadvantageously insufficient because of a thermosetting silicone resin used. In order to remove the problem of such storability, there was proposed the complicated means that a solution of a curing catalyst is applied on the layer of the uncured silicone resin after the toner images are formed on the surface of the silicone layer, and then the silicone layer is cured.

Japanese Patent Disclosure No. 51-16105 discloses a method for the preparation of a master for planographic printing plate which comprises forming on a base plate a coating layer of a silicone rubber composition containing two kinds of curing catalysts, then photosensitizing one of the catalysts, and thermally activating the other catalyst to cure the silicone rubber composition. This method is also defective in the complexity of formulating the curing catalysts, one being a photosensitive compound, such as an azide compound, and the other being a compound capable of being thermally activated, such as an organic peroxide, as well as the poor storability of the silicone rubber composition admixed with such catalyst system and the necessity of a heating step for sufficiently curing the silicone rubber composition.

Japanese Patent Disclosure No. 51-134204 discloses a method for the preparation of a planographic printing plate which comprises sandwiching a layer of photocurable silicone rubber between two base plates to form a complex lamination, then exposing the complex lamination to light through a transparency overlaid thereon, and splitting the base plates to produce the desired printing plate. In this method, disadvantageously, the photocurable silicone rubber composition have to be added with an ethylenical monomer or oligomer which is polymerizable by addition reaction, as the crosslinking agent of the silicone rubber. Thus, the composition is quite limitative with respect of its compatibility with the silicone rubber component and the crosslinking agent as well as with respect of the storability of the composition before it is put to use.

Further, an original transparency to be used must be prepared by a complicated process and, when applied to the laminate, tends to contact therewith in an unsatisfactory condition and move out of position, causing poor resolving in printing.

SUMMARY OF THE INVENTION

The present invention has been completed as a result of extensive investigations carried out by the inventors to produce a dry planographic printing plate without the necessity of using dampening water in the printing process in a simple and easy process free from the above-described problems and disadvantages encountered in the prior art.

The method of the present invention for the preparation of a dry planographic printing plate comprises the steps of (a) coating one surface of a substrate which is transparent to ultraviolet light with an uncured photocurable silicone, (b) bringing the surface of the substrate thus coated into direct contact with a surface of a base plate to form a laminate, (c) providing on the other surface of the substrate an image pattern made of a material which is opaque to ultraviolet light, (d) irradiating the laminate with ultraviolet light from the side of the image pattern, and (e) separating the substrate from the base plate so that a portion of the photocured silicone layer is transferred to the surface of the base plate to form a non-image area, while a portion of the uncured silicone layer stays in situ on the surface of the substrate, corresponding to the image pattern on the surface of the substrate.

Thus a planographic printing plate prepared by the method of the present invention has a base plate whose surface consists of a plurality of bare image areas and a plurality of photocured silicone non-image areas.

BRIEF DESCRIPTION OF THE DRAWINGS

Each of FIGS. 1 to 4 is a cross sectional view of the plates illustrating the steps of the process for the preparation of the planographic printing plate in accordance with the method of the present invention, in which 1 is a substrate which is transparent to ultraviolet light; 2 is a layer of uncured photocurable silicone; 2' is a layer of photocured silicone; 3 is a layer of a surface treatment agent; 4 is a base plate; 5 is an image pattern formed with a material which is opaque to ultraviolet light; and 6 denotes beams of ultraviolet light.

DETAILED DESCRIPTION OF THE PREFERRED EMBODIMENTS

In the following the method of the present invention is explained with reference to the drawings.

Figure 4:
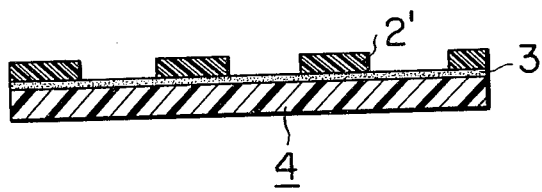

The dry planographic printing plate prepared by the method of the present invention is shown by FIG. 4.

The printing plate is composed of base plate 4 provided, optionally, with a layer of surface treatment agent 3 and ink repellent layer 2' forming non-image areas of photocured silicone, the image areas being formed with the layer of surface treatment agent 3 laid bare.

Figure 1:
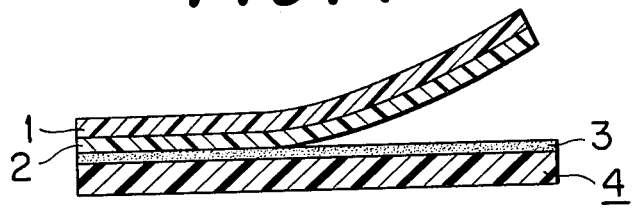

Now referring to FIG. 1, one surface of substrate 1 is provided with layer 2 of photocurable but uncured silicone in adhesive contact, and the layer surface is brought into direct contact with the surface of base plate 4 which has, though optionally, coated with surface treatment agent 3 by pressing to form a laminate. Care must be taken in the lamination to use a sufficient pressing force in order to avoid the formation of bubbles between layer 2 and base plate 4. For example, the lamination is performed either by pressing the stack of the substrate and the base plate using a roller or, more efficiently, by passing the stack through a laminating roll or a calendering roll.

Layer 2 of the photocurable silicone is formed on the surface of substrate 1 by uniformly applying a solution of the silicone, which may optionally be diluted with an organic solvent to have a suitable viscosity, by means of brush coating, rotary coating, rod coating, roll coating, or the like, followed by evaporation of the solvent and drying. The thickness of the photocurable silicone layer is preferably in the range from 2 to 15 $\mu m$ as dried.

The organic solvents suitable for the above purpose are exemplified by ketone solvents, such as methylethyl ketone and methyl isobutyl ketone; aromatic hydrocarbon solvents, such as benzene, toluene, and xylene; halogenated hydrocarbon solvents, such as trichloroethylene and tetrachloroethylene; alcohol solvents, such as isopropyl alcohol and octyl alcohol; and ester solvents, such as methyl acetate and ethyl acetate.

Substrate 1 may be a film or sheet of plastics having a high transmission of ultraviolet light, such as polypropylene, saturated polyester, cellulose triacetate, cellulose diacetate, polyvinyl chloride, polyvinylidene chloride, polystyrene, acrylic resins, and polycarbonate resins.

It is recommended to use a material having a sufficiently high heat resistance, such as saturated polyester and cellulose triacetate, as the substrate, when the toner images is the provided by the technique of electrophotography.

As will be evident from the description given later with reference to FIG. 3, the material of substrate 1 is required to have the surface property that the uncured photocurable silicone can well spread over and stick to the surface while the cured layer of the silicone can be readily peeled off and removed from the surface of the substrate. The surface of substrate 1 is preferred to be as smooth as possible since a matted surface results in rendering the surface of the cured silicone rugged, and adversely influencing the ink repellency of the surface.

Base plate 4 is made of a metal, e.g., copper, steel, aluminum, stainless steel, and zinc; plastics, e.g., polypropylene, saturated polyester, cellulose triacetate, cellulose diacetate, polyvinyl chloride, polyvinylidene chloride, polystyrene, acrylic resins, and polycarbonate resins; resin-coated paper; or metal-deposited paper. It is desired to clean the surface of the base metal prior to application.

It may be added that the material of the base plate is preferred to be a material having a sufficiently heat resistance when the tonner images are provided on the surface of the substrate by the technique of electrophotography after the substrate has been adhered to the base plate.

The image patterns are formed with a material which is opaque to ultraviolet light on the surface of substrate 1 which is transparent to ultraviolet light. According to this method, image patterns 5 are formed on substrate 1 either by reproducing the original patterns by an electrophotographic copying machine with a toner or by manual writing with a writing ink which is untransparent to ultraviolet light. The formation of the image patterns on the substrate may be carried out either before of after the substrate is adhered to the base plate.

Figure 2:
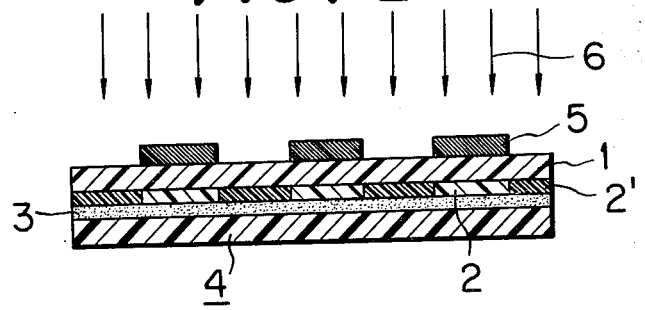

The above step is followed by exposing and irradiating the laminate to and with light from the side of image patterns 5 as shown in FIG. 2.

The photocurable silicone is cured by the irradiation on the non-image areas whereby the cured silicone is adhesively bonded to the surface of base plate 4. In order to obtain a stronger bonding of the cured silicone to base plate 4 it is preferred to have the surface of base plate 4 matted or treated in advance with a primer, or more preferred to treat the matted surface with the primer. Illustrative of the primers suitable for the purpose are vinyl tris(2-methoxyethoxy) silane, 3-glycidoxypropyl trimethoxy silane, N-(trimethoxysilylpropyl) ethylenediamine, 3-methacryloxypropyl trimethoxy silane, 3-aminopropyl-triethoxy silane, mixtures thereof, and partial (co)hydrolyzates thereof. The primers is applied to the surfaces by the conventional method, for example, rotary coating, rod coating, brush coating, or spray coating.

On the other hand, the photocurable silicone on the image areas is left uncured even after exposure to ultraviolet light, since the light is absorbed in the material opaque to ultraviolet light forming the image patterns on substrate 1 before reaching the silicone layer. The light source of ultraviolet light is exemplified by xenon lamps and low-, medium- and high-pressure mercury lamps.

Figure 3:
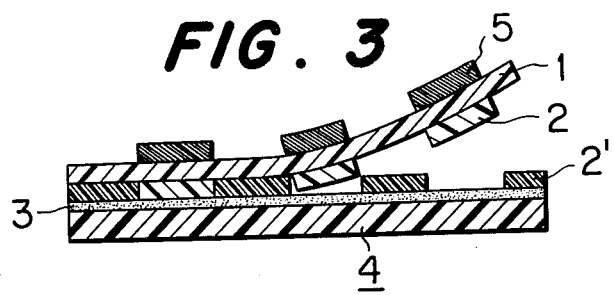

After completion of the step of exposure to light, substrate 1 is peeled off base plate 4 as shown in FIG. 3.

In the peeling of substrate 1 from base plate 4, the layer of the cured photocurable silicone is left on the surface of base plate 4, strongly adhered to the non-image areas, while the uncured photocurable silicone on the image areas is removed together with substrate 1, separated from base plate 4, since it adheres more strongly to the substrate than to the base plate. Thus, the desired printing plate can be formed as shown in FIG. 4.

The exact mechanism by which the desired planographic printing plate is obtained in an advantageous manner by the method of the present invention is not well understood, but it may be that the transfer of the cured layer of the photocurable silicone from the surface of substrate 1 to the surface of base plate 4 takes place since both surfaces have a different bonding strength to the silicone cured by exposure to light as in FIG. 2. In constrast thereto, the unexposed, or uncured silicone on the image areas is removed as adhering to substrate 1, it has a stronger adhesion to the substrate than to the base plate. This is because the silicone is applied to the surface of the substrate in the form of solution, resulting in a better adhesion than when contacted with the primer-treated base plate by dry lamination.

The photocurable silicone suitable for the preparation of the dry planographic printing plate in accordance with the method of the present invention is not limitative insofar as it is readily cured by irradiation with ultraviolet light. Examples of the suitable silicones are the following.

(1) An organopolysiloxane, as disclosed in U.S. Pat. No. 4,019,904, containing in a molecule at least one maleimido group-containing organosiloxane unit expressed by the formula

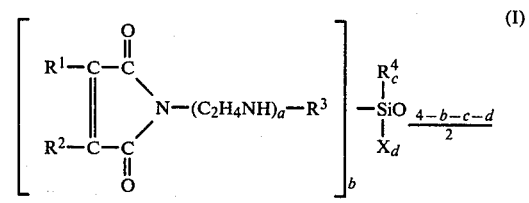

where $R^1$ is an aromatic ring residue or a heterocyclic ring residue, $R^2$ is a hydrogen atom, halogen atom, cycano group or a monovalent hydrocarbon group having 1 to 4 carbon atoms, $R^3$ is a divalent hydrocarbon group having 1 to 10 carbon atoms, $R^4$ is a monovalent hydrocarbon group, X is a hydroxy group or a hydrolyzable monovalent atom or group, a is 0 or 1, $0<b\leq1$, $0\leq c\leq3$ and $0\leq d\leq3$ with the proviso that $0<b+c+d\leq4$, or by the formula

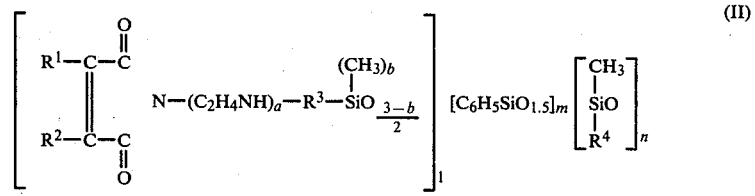

where $R^1$, $R^2$ and $R^3$ have the same meaning as in formula (I) above, $R^4$ is a methyl or a trifluoropropyl group, a and b are each 0 or 1, and l, m and n are each positive integers, n being not smaller than 25, with the proviso that n/l is from 25 to 2,000 and n/m is from 2.5 to 50.

(2) An organopolysiloxane containing in a molecule at least one acryloxy group-containing organosiloxane unit expressed by the following formula as disclosed in British Pat. No. 1,323,869:

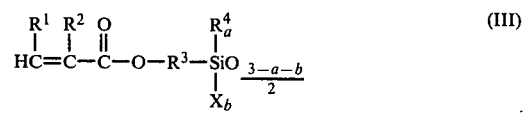

where $R^1$ is a hydrogen atom, phenyl group or a halogenated phenyl group, $R^2$ is a hydrogen atom or a methyl group, $R^3$ is a divalent hydrocarbon group or a halogenated divalent hydrocarbon group having 1 to 10 carbon atoms, $R^4$ is a monovalent hydrocarbon group or a halogenated hydrocarbon group having 1 to 10 carbon atoms, X is a hydroxy group or an alkoxy group having 1 to 4 carbon atoms, a is 0 or 1 and b is 0, 1 or 2 with the proviso that a+b is 0, 1 or 2, or by the formula as disclosed in Japanese Patent Disclosure No. 52-113805:

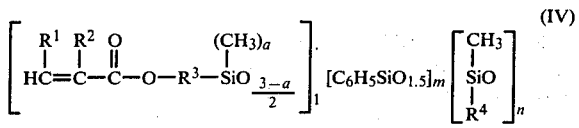

where $R^1$, $R^2$ and $R^3$ have the same meaning as in formula (III) above, $R^4$ is a methyl group or a trifluoropropyl group, a is 0 or 1, and l, m and n are each positive integers, n being not smaller than 100, with the proviso that n/l is from 35 to 2,000 and n/m is from 4 to 40.

(3) A mixture of an organopolysiloxane containing in a molecule at least one mercapto group-containing organosiloxane unit and an organopolysiloxane containing in a molecule at least one vinyl group-containing organosiloxane unit as disclosed in Japanese Patent application No. 51-91069.

(4) A mixture of an organopolysiloxane containing in a molecule at least one vinyl group-containing organosiloxane unit and an organohydrogenpolysiloxane as disclosed in Japanese patent application No. 51-90719.

The above-mentioned organopolysiloxanes or mixtures of organopolysiloxanes may be mixed with photosensitizers, inhibitors for thermal polymerization, fillers, and other conventional ingredients.

The method of the present invention is a method to produce dry planographic printing plates with a high printing durability in the absence of dampening water in a completely dry process. In particular, no transparency of the original is required since the image patterns are formed on the substrate by the technique of electrophotography using a non-transparent original. Thus, the plate making processes can be curtailed to a great extent and, besides, the complete dry process beginning with the preparation of the original can be available for the making of planographic printing plates having an excellent printing durability in the absence of any dumpening solution. In addition, the photocurable silicones used in the present invention, different from the silicones conventionally used in the prior art, have photocurability in their molecules themselves, giving much larger freedom in the formulation of the photosensitive compositions, and possibility of enhancing the printing durability of the plate by using an organopolysiloxane having a larger molecular weight.

This invention will now be further illustrated by the following examples. In the examples Me and Ph denote a methyl group and a phenyl group, respectively, and parts and percentages are all by weight.

EXAMPLE 1

A solution of 260 g of dimethyldichlorosilane and 50 g of phenyltrichlorosilane in 1,000 g of toluene was dropped into 1,100 g of water kept at 25° C. so as to cohydrolyze the silanes. The resulting cohydrolyzate was subjected to washing with water, neutralization and dehydration, and a toluene solution containing a copolymeric organopolysiloxane at a concentration of 15% was obtained.

A mixture of 1,000 g of the above obtained toluene solution and 56 g of 3-aminopropyl triethoxysilane was admixed with 0.2 g of dibutyltin dioctoate, to produce a toluene solution of a 3-aminopropyl group-containing organopolysiloxane as the reaction product of the deethanolation condensation expressed by the following average unit formula:

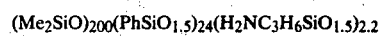

Into the thus produced toluene solution of 3-aminopropyl group-containing organopolysiloxane was dropped a solution of 3.94 g of α-phenylmaleic anhydride in 10 ml of dimethylformamide at 20° C., the amount of the α-phenylmaleic anhydride being equivalent to the 3-aminopropyl groups. The reaction between the α-phenylmaleic anhydride and the 3-aminopropyl groups was conducted at 25° C. for 1 hour and then by heating at 110° C. for 4 hours, while removing the condensation water produced by the reaction continuously out of the reaction vessel. As a result, a maleimido group-containing organopolysiloxane expressed by the following average unit formula as identified by the infrared absorption spectral analysis was obtained.

where Q is a phenyl-substituted maleimido group expressed by the following formula:

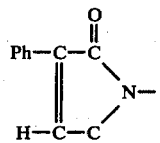

The organopolysiloxane thus obtained was solid at room temperature, its softening temperature being in the range from 110° to 120° C.

Then, a 15% toluene solution of the above maleimido group-containing organopolysiloxane was applied over a polypropylene film 9 μm thick to form a layer of the organopolysiloxane 5 μm (as dried) thick.

Separately, a saturated polyester sheet 100 μm thick, one of the surfaces of which was matted, was coated with N-(trimethoxysilylpropyl)ethylenediamine, to form a coating film 0.5 μm thick (as dried) on the matted surface. On this coating film of the polyester sheet was put the above polypropylene film with both surfaces directly contacting to each other by pressing, to form a laminate. On the surface of the polypropylene film of the laminate image patterns were formed by manual writing with a felt pen using a writing ink which is opaque to ultraviolet light, followed by irradiation with ultraviolet light of 365 nm wavelength in an intensity of 80 W/m² for 45 seconds of exposure time. Thereupon the polypropylene film and the polyester sheet were separated.

Upon the separation, it was observed that the photocured organopolysiloxane layer on the areas exposed to light through the non-image areas on the polypropylene film had been transferred onto the surface of the polyester sheet leaving the uncured organopolysiloxane layer on the polypropylene film corresponding to the unexposed areas by being covered with the image patterns on the polypropylene film opaque to ultraviolet light.

The thus obtained polyester sheet as a printing plate was mounted on an offset printing press (manufactured by A. B. Dick Co., U.S.A.), and a printing test was performed without the supply of dampening water, resulting in producing more than 10,000 printed copies with satisfactory sharpness.

EXAMPLE 2

A mixture of 247 g of a 15% toluene solution of an α,ω-dihydroxydimethylpolysiloxane expressed by the average formula

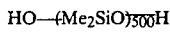

$HO\text{---}(Me_2SiO)_{500}H$ and 60 g of a 15% toluene solution of a hydrolyzate of phenyltrichlorosilane was added with 0.25 g of 3-methacryloxypropyl trimethoxysilane, 0.01 g of dibutyl hydroxytoluene and 0.1 g of dibutyltin dilaurate. The resulting mixture was heated under reflux of toluene for 8 hours while continuously removing the condensation water produced. As a result, a toluene solution of a copolymeric organopolysiloxane as the condensation product having a 15% solid content and a viscosity of 28.5 centistokes at 25° C. was obtained.

A coating composition was prepared by blending 100 parts of the above-obtained solution of the photopolymerizable organopolysiloxane with 5 parts of 4-trimethylsilyl benzophenone and 900 parts of toluene. The thus prepared coating composition was applied on a polyester film 6 μm thick, using a roll coater, to form a coating film 7 μm thick (as dried).

Separately, an aluminum plate 200 μm thick having a matted surface was roll-coated with 3-methacryloxypropyl trimethoxysilane as a primer on the matted surface in a coating amount to give a 0.2 μm thick (as dried) coating layer.

Subsequently, the lamination, exposure and separation procedures were performed in the same manner as in Example 1 to finally obtain a planographic printing plate.

The thus prepared printing plate was subjected to the same printing test as in Example 1 and, as a result, more than 15,000 printed copies with satisfactory sharpness were produced.

EXAMPLE 3

A solution of 258 g of dimethyldichlorosilane and 53 g of phenyltrichlorosilane in 1,022 g of toluene was dropped into 1,124 g of water kept at a temperature not exceeding 25° C. for hydrolyzation. The resultant organic solution was washed with water, neutralized and dehydrated, to obtain a 15% toluene solution of a copolymeric organopolysiloxane as the hydrolysis product.

Into 1,200 g of the above-obtained solution were added 7.4 g of 3-methacryloxypropyl methyldimethoxysilane, 6.0 g of 4-dimethylamino-4'-(trimethoxysilylethyl)dimethylsilyl benzophenone, 0.1 g of methoxy hydroquinone and 0.4 g of butyltin dioctoate. The resultant solution was heated under reflux of toluene for 5 hours to prepare a toluene solution of a condensation product having a 15% solid content and a viscosity of 20.1 centistokes at 25° C.

A 12 μm thick saturated polyester film was coated with the thus prepared solution of the self-sensitizing photocurable organopolysiloxane in a coating amount to form the thickness of 7 μm (as dried).

Separately, an aluminum plate 150 μm thick having a matted surface was roll-coated with 3-methacryloxypropyl trimethoxysilane to form a 0.5 μm thick (as dried) coating film.

The aluminum plate and the polyester film were laminated in the same manner as in Example 1 except that the image patterns on the polyester film were formed by a plane paper copying machine (Model 1200, product of Richo Co., Japan), to manufacture the desired printing plate. The printing test undertaken with this printing plate gave results as good as in Example 1.

EXAMPLE 4

The same procedure as in Example 3 was repeated except that the solution of the photopolymerizable organopolysiloxane was prepared by dissolving 100 parts of an organopolysiloxane having a block structure expressed by the following average formula

$(Me_2SiO)_{400}(PhSiO_{1.5})(CH_2\!=\!CH\!-\!C_3H_6SiO_{1.5})_4$ and 5 parts of tetra(3-mercaptopropyl) tetramethyl cyclotetrasiloxane and 2 parts of 4,4'-bis(dimethylamino) benzophenone in 900 parts of toluene.

The same printing test as in Example 1 was undertaken with a printing plate prepared in this example. The results were the same as in Example 1.

EXAMPLE 5

The same procedure as in Example 4 was repeated except that the coating solution of the organopolysiloxane was prepared with tetramethyltetrahydrogen cyclotetrasiloxane, instead of tetra(3-mercaptopropyl) tetramethyl cyclotetrasiloxane, in the same amount.

The same printing test as in Example 1 was undertaken with a printing plate prepared. The results were the same as in Example 3.

What is claimed is:

1. A method for the preparation of a dry planographic printing plate comprising the steps of
   (a) coating one surface of a substrate which is transparent to ultraviolet light with an uncured photocurable silicone,
   (b) bringing the surface of the substrate thus coated into direct contact with a surface of a base plate which has been treated with a primer selected from the group consisting of vinyl tris(2-methoxyethoxy) silane, 3-(glycidoxypropyl trimethoxy silane, N-(trimethoxysilylpropyl) ethylenediamine, 3-methacryloxypropyl trimethoxy silane, 3-aminopropyltriethoxy silane, mixtures thereof, and partial (co)hydrolyzates thereof, to form a laminate,
   (c) producing an image pattern made of a material which is opaque to the ultraviolet light on the other surface of the substrate electrophotographically or manually by applying an ultraviolet opaque ink directly on said other surface,
   (d) irradiating the laminate with ultraviolet light from the side of the image pattern, and
   (e) separating the substrate from the base plate to allow a portion of the photocured silicone coating to transfer to the surface of the base plate, and a portion of the uncured silicone coating to stay in situ on the surface of the substrate.

2. The method as claimed in claim 1 wherein the photocurable silicone is an organopolysiloxane containing in a molecule at least one maleimido group-containing organosiloxane unit.

3. The method as claimed in claim 1 wherein the photocurable silicone is an organopolysiloxane expressed by the formula

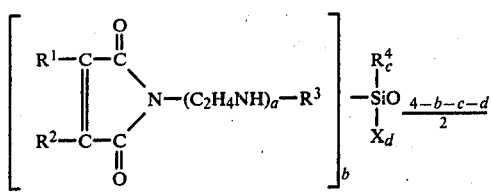

where $R^1$ is an aromatic ring residue or a heterocyclic ring residue, $R^2$ is a hydrogen atom, halogen atom, cycano group or a monovalent hydrocarbon group having 1 to 4 carbon atoms, $R^3$ is a divalent hydrocarbon group having 1 to 10 carbon atoms, $R^4$ is a monovalent hydrocarbon group, X is a hydroxy group or a hydrolyzable monovalent atom or group, a is 0 or 1, $0 < b \leqq 1$, $0 \leqq c \leqq 3$ and $0 \leqq d \leqq 3$ with the proviso that $0 < b+c+d \leqq 4$.

4. The method as claimed in claim 1 wherein the photocurable silicone is an organopolysiloxane containing in a molecule at least one acryloxy group-containing organosiloxane unit.

5. The method as claimed in claim 1 wherein the photocurable silicone is an organopolysiloxane expressed by the formula

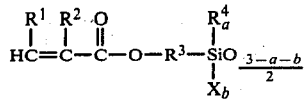

where $R^1$ is a hydrogen atom, phenyl group or a halogenated phenyl group, $R^2$ is a hydrogen atom or a methyl group, $R^3$ is a divalent hydrocarbon group or a halogenated divalent hydrocarbon group having 1 to 10 carbon atoms, $R^4$ is a monovalent hydrocarbon group or a halogenated hydrocarbon group having 1 to 10 carbon atoms, X is a hydroxy group or an alkoxy group having 1 to 4 carbon atoms, a is 0 or 1 and b is 0, 1 or 2 with the proviso that a+b is 0, 1 or 2.

6. The method as claimed in claim 1 wherein the coating layer of the photocurable silicone formed on the substrate has a thickness in the range from 2 to 15 μm as dried.

7. The method as claimed in claim 1 wherein the base plate is made of a material selected from metals, plastics, resin coated paper, and metal deposited paper.

8. The method as claimed in claim 1 wherein the surface of the base plate is matted.

9. The method as claimed in claim 1 wherein the substrate is made of a material selected from the group consisting of polypropylene, saturated polyester, cellulose triacetate, cellulose diacetate, polyvinyl chloride, polyvinylidene chloride, polystyrene, acrylic resins, and polycarbonate resins.

* * * * *